(12) United States Patent
Jeong et al.

(10) Patent No.: US 12,153,223 B2
(45) Date of Patent: Nov. 26, 2024

(54) DISPLAY MODULE AND HEAD-MOUNTED DISPLAY DEVICE THEREWITH

(71) Applicant: SAMSUNG DISPLAY CO., LTD., Yongin-si (KR)

(72) Inventors: Yeri Jeong, Suwon-si (KR); Tae Yong Eom, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/463,473

(22) Filed: Sep. 8, 2023

(65) Prior Publication Data
US 2023/0418073 A1 Dec. 28, 2023

Related U.S. Application Data

(62) Division of application No. 16/710,925, filed on Dec. 11, 2019, now Pat. No. 11,867,905.

(30) Foreign Application Priority Data

Dec. 13, 2018 (KR) ........................ 10-2018-0161050

(51) Int. Cl.
G02B 27/01 (2006.01)
H10K 50/84 (2023.01)

(52) U.S. Cl.
CPC ....... G02B 27/0172 (2013.01); H10K 50/841 (2023.02)

(58) Field of Classification Search
CPC ............ G02B 27/0172; G02B 27/0176; G02B 2027/0118; G02B 27/017; G02B 6/0038; G02B 6/0058; G02B 5/18–1895; H10K 50/841; H10K 59/35; H10K 59/871; (Continued)

(56) References Cited

U.S. PATENT DOCUMENTS 7,009,340 B2  3/2006  Asai et al.
8,076,171 B2  12/2011  Park et al.
8,749,736 B2  6/2014  Yoon
(Continued)

FOREIGN PATENT DOCUMENTS

CN  101101384 A  1/2008
CN  106486525 A  3/2017
(Continued)

OTHER PUBLICATIONS

Notice of Allowance dated Jul. 18, 2023 in corresponding U.S. Appl. No. 16/710,925.
(Continued)

Primary Examiner — Roberto W Flores
(74) Attorney, Agent, or Firm — F. Chau & Associates, LLC

(57) ABSTRACT

A display module includes a plurality of light-emitting elements and a sealing element sealing the plurality of light-emitting elements. The sealing element includes a base part including a transparent material and a cover layer. The cover layer is in contact with a surface of the base part and includes a plurality of first patterns, each of which is engraved in an intaglio manner to a first depth, and a plurality of second patterns, each of which is engraved in an intaglio manner to a second depth different from the first depth.

8 Claims, 11 Drawing Sheets

(58) Field of Classification Search
CPC ............... H10K 59/879; H10K 59/122; H10K 59/1213; H10K 59/123
See application file for complete search history.

(56) References Cited

U.S. PATENT DOCUMENTS

| | | | |
|---|---|---|---|
| 10,008,697 B2 | 6/2018 | Jang et al. | |
| 2003/0067686 A1* | 4/2003 | Shiono | G11B 7/1275 359/569 |
| 2007/0109811 A1 | 5/2007 | Krijn et al. | |
| 2009/0097122 A1 | 4/2009 | Niv | |
| 2010/0253882 A1 | 10/2010 | Han et al. | |
| 2011/0090697 A1 | 4/2011 | Matsuzaki et al. | |
| 2012/0300283 A1 | 11/2012 | Fujiyoshi et al. | |
| 2013/0207099 A1 | 8/2013 | Shu et al. | |
| 2015/0293402 A1 | 10/2015 | Shinkai et al. | |
| 2016/0274275 A1 | 9/2016 | Kim et al. | |
| 2017/0082907 A1 | 3/2017 | Park et al. | |
| 2017/0263691 A1 | 9/2017 | Seo et al. | |
| 2018/0149909 A1 | 5/2018 | Zhao et al. | |
| 2018/0299607 A1* | 10/2018 | Menezes | G02B 27/0172 |
| 2019/0162955 A1 | 5/2019 | Jang et al. | |
| 2020/0111995 A1 | 4/2020 | Eom et al. | |
| 2020/0192100 A1 | 6/2020 | Jeong et al. | |

FOREIGN PATENT DOCUMENTS

| | | |
|---|---|---|
| KR | 10-0975462 | 8/2010 |
| KR | 10-1125635 | 3/2012 |
| KR | 10-1274591 | 6/2013 |
| KR | 10-2016-0056585 | 5/2016 |
| KR | 10-2016-0094581 | 8/2016 |
| KR | 10-2017-0034605 | 3/2017 |
| KR | 10-2017-0106088 | 9/2017 |
| KR | 10-1878981 | 7/2018 |
| KR | 10-2018-0117968 | 10/2018 |
| KR | 10-2020-0039057 | 4/2020 |

OTHER PUBLICATIONS

Office Action dated May 27, 2022 in corresponding U.S. Appl. No. 16/710,925.
Office Action dated Nov. 19, 2021 in corresponding U.S. Appl. No. 16/710,925.

* cited by examiner

DISPLAY MODULE AND HEAD-MOUNTED DISPLAY DEVICE THEREWITH

CROSS-REFERENCE TO RELATED APPLICATIONS

This patent application is a divisional application of U.S. patent application Ser. No. 16/710,925, filed on Dec. 11, 2019, which claims priority under 35 U.S.C. § 119 to Korean Patent Application No. 10-2018-0161050, filed on Dec. 13, 2018, the disclosure of which is incorporated by reference herein in its entirety.

TECHNICAL FIELD

Exemplary embodiments of the present inventive concept relate to a display module and a display device including the display module, and more particularly, to a head-mounted display device worn on a user's head.

DISCUSSION OF THE RELATED ART

A head-mounted display device is a display device worn on user's head that may provide augmented reality or virtual reality content to the user. A head-mounted display device for realizing augmented reality provides a virtual graphic image displayed on a semitransparent display to a user. In this case, the user can view not only the virtual graphic image, but also a real object at the same time (e.g., the virtual graphic may be superimposed over the real object). A head-mounted display device for realizing virtual reality provides a virtual graphic image to a user's eyes.

A screen-door effect (SDE) is a certain type of noise pattern which may be recognized by a user viewing a head-mounted display device. The SDE may also be called a fixed pattern noise. The SDE may arise from a difference in luminance between center and peripheral regions of a light-emitting element in each pixel. Due to the SDE, a boundary between pixels may be recognized by a user, thus deteriorating display quality.

Since the head-mounted display device provides a wider field of view to a user compared with a typical flat-panel display device, the head-mounted display device may be more vulnerable to deterioration in display quality caused by the SDE.

SUMMARY

An exemplary embodiment of the inventive concept provides a display device configured to suppress a screen-door effect (SDE), and a head-mounted display device therewith.

According to an exemplary embodiment of the inventive concept, a display module includes a plurality of light-emitting elements and a sealing element sealing the plurality of light-emitting elements. The sealing element includes a base part including a transparent material and a cover layer in contact with a surface of the base part. The cover layer includes a plurality of first patterns, each of which is engraved in an intaglio manner to a first depth, and a plurality of second patterns, each of which is engraved in an intaglio manner to a second depth different from the first depth.

In an exemplary embodiment, the cover layer includes silicon dioxide.

In an exemplary embodiment, the plurality of first patterns and the plurality of second patterns are alternatingly disposed.

In an exemplary embodiment, a thickness of the base part may range from about 100 μm to about 300 μm, a thickness of the cover layer may range from about 500 nm to about 600 nm, and each of the first depth and the second depth may range from about 100 nm to about 200 nm.

In an exemplary embodiment, the second depth is larger than the first depth, and a difference between the second depth and the first depth ranges from about 70 nm to about 90 nm.

In an exemplary embodiment, the cover layer further includes a plurality of third patterns, each of which is engraved in an intaglio manner to a third depth different from the first depth and the second depth. The third depth ranges from about 100 nm to about 200 nm.

In an exemplary embodiment, a largest difference between the first depth, the second depth, and the third depth ranges from about 70 nm to about 90 nm.

In an exemplary embodiment, the plurality of first patterns, the plurality of second patterns, and the plurality of third patterns are alternatingly disposed.

In an exemplary embodiment, each of the plurality of second patterns is disposed between one of the plurality of first patterns and one of the plurality of third patterns.

In an exemplary embodiment, an inner side surface of the cover layer defining at least one of the plurality of first patterns and the plurality of second patterns is inclined at an angle of about 60° to about 85° relative to the base part.

According to an exemplary embodiment of the inventive concept, a display module includes a plurality of light-emitting elements, and a sealing element sealing the plurality of light-emitting elements and including a base part including a transparent material and a cover layer disposed on a surface of the base part. The cover layer includes a base layer in contact with the surface of the base part, a plurality of first patterns, each of which protrudes from the base layer by a first length, and which are spaced apart from each other by a first distance, a plurality of second patterns, each of which protrudes from a portion of a corresponding one of the plurality of first patterns by a second length, and a plurality of third patterns, each of which protrudes from another portion of a corresponding one of the plurality of first patterns by the second length.

In an exemplary embodiment, each of the plurality of second patterns is spaced apart from a corresponding one of the plurality of third patterns protruding from a same first pattern by a second distance.

In an exemplary embodiment, the cover layer includes silicon dioxide.

In an exemplary embodiment, a thickness of the base part ranges from about 100 μm to about 300 μm, and a thickness of the base layer ranges from about 250 nm to about 400 nm. The first length ranges from about 70 nm to about 90 nm, and the second length ranges from about 10 nm to about 130 nm.

In an exemplary embodiment, a side surface of each of the plurality of first patterns or a side surface of each of the plurality of second patterns is inclined at an angle of about 60° to about 85° relative to the base layer.

According to an exemplary embodiment of the inventive concept, a head-mounted display device includes a display module including a plurality of light-emitting elements and a sealing element sealing the light-emitting elements, and a body portion containing the display module. An opening is defined in the body portion that exposes at least a portion of the display module to a user. The head-mounted display device further includes a strap portion connected to the body portion and configured to fix the body portion to a head of the user. The sealing element includes a base part including a transparent material and a cover layer in contact with a surface of the base part. The cover layer includes a plurality of first patterns, each of which is engraved in an intaglio manner to a first depth, and a plurality of second patterns, each of which is engraved in an intaglio manner to a second depth different from the first depth.

In an exemplary embodiment, the cover layer includes silicon dioxide, and the plurality of first patterns and the plurality of second patterns are alternatingly disposed.

In an exemplary embodiment, a thickness of the base part ranges from about 100 μm to about 300 μm, a thickness of the cover layer ranges from about 500 nm to about 600 nm, and each of the first depth and the second depth ranges from about 100 nm to about 200 nm.

In an exemplary embodiment, the second depth is larger than the first depth, and a difference between the second depth and the first depth ranges from about 70 nm to about 90 nm.

In an exemplary embodiment, the cover layer further includes a plurality of third patterns, each of which is engraved in the intaglio manner to a third depth different from the first depth and the second depth. The third depth is larger than the first depth and is smaller than the second depth.

BRIEF DESCRIPTION OF THE DRAWINGS

The above and other features of the inventive concept will become more apparent by describing in detail exemplary embodiments thereof with reference to the accompanying drawings, in which.

Figure 1:
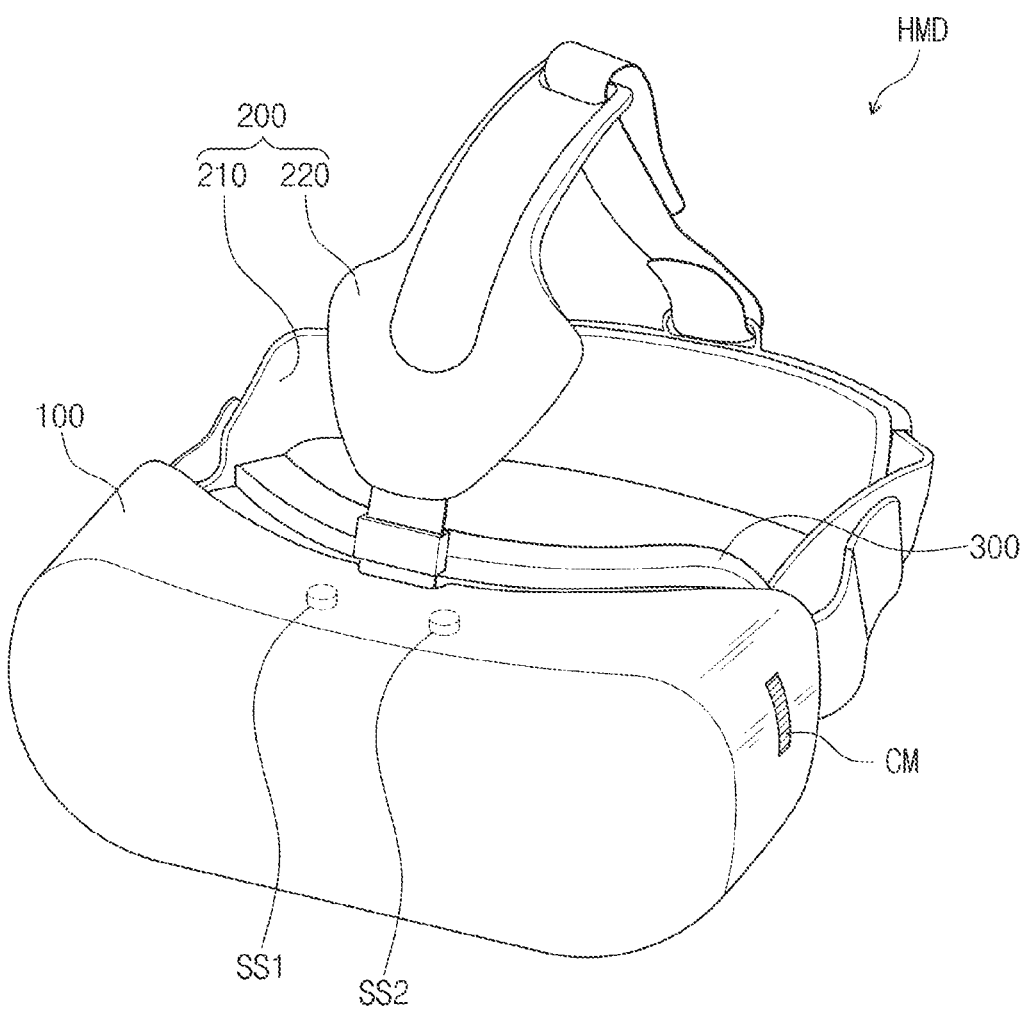
FIG. 1 is a perspective view of a display device according to an exemplary embodiment of the inventive concept.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements should be interpreted in a like fashion.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise.

Exemplary embodiments of the inventive concept are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing, as would be understood by a person having ordinary skill in the art.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 2:
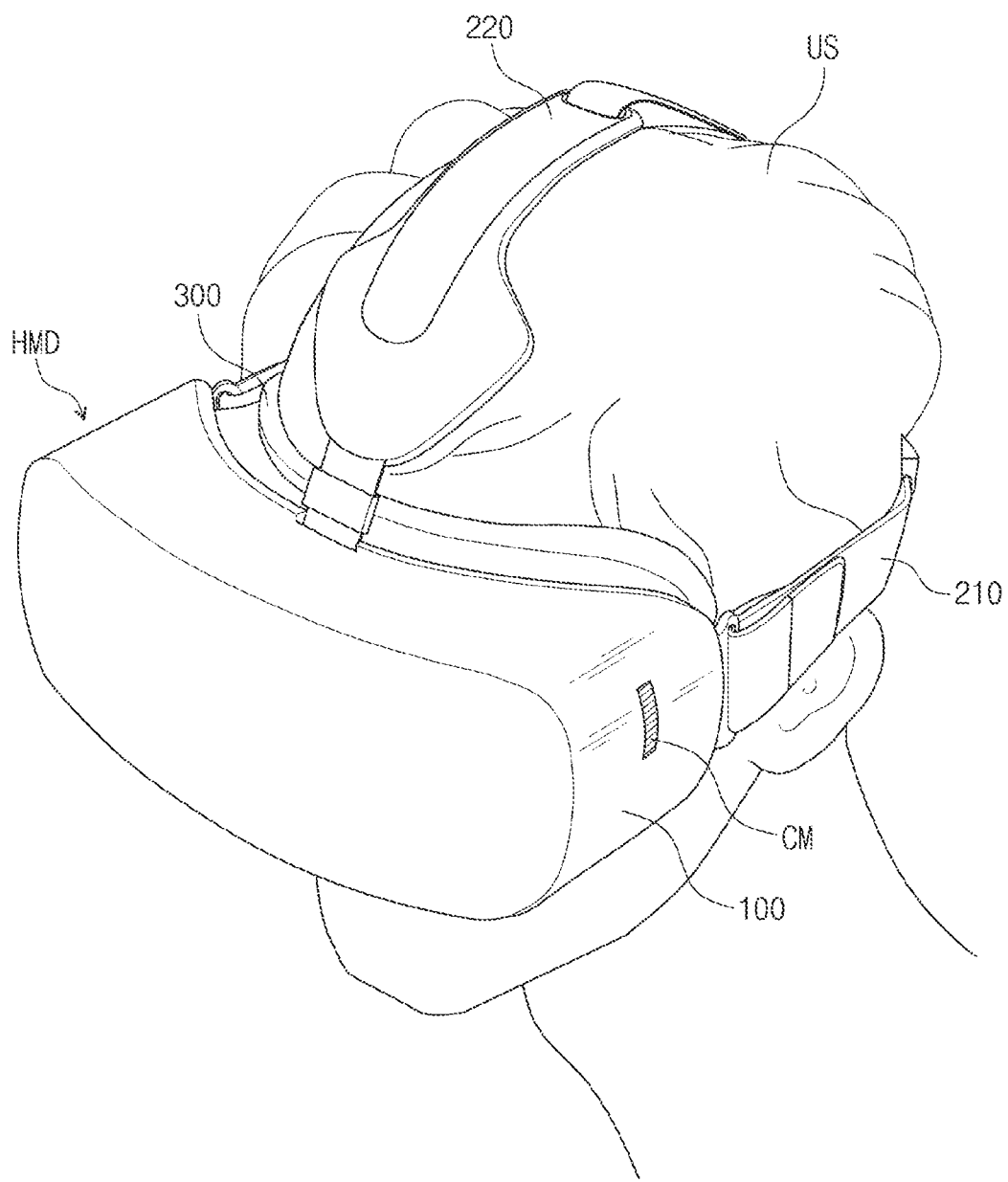
FIG. 2 exemplarily illustrates a user wearing the display device shown in FIG. 1.

FIG. 1 is a perspective view of a display device HMD according to an exemplary embodiment of the inventive concept. FIG. 2 exemplarily illustrates a user US wearing the display device HMD of FIG. 1.

Referring to FIGS. 1 and 2, the display device HMD may be a head-mounted display device, which can be worn on a head of the user US. The display device HMD may provide an image to the user US while preventing the user US from seeing through his or her peripheral vision. Since the user's peripheral vision is blocked, the user US wearing the display device HMD may be more immersed in virtual reality content provided via the display device HMD.

Figure 3:
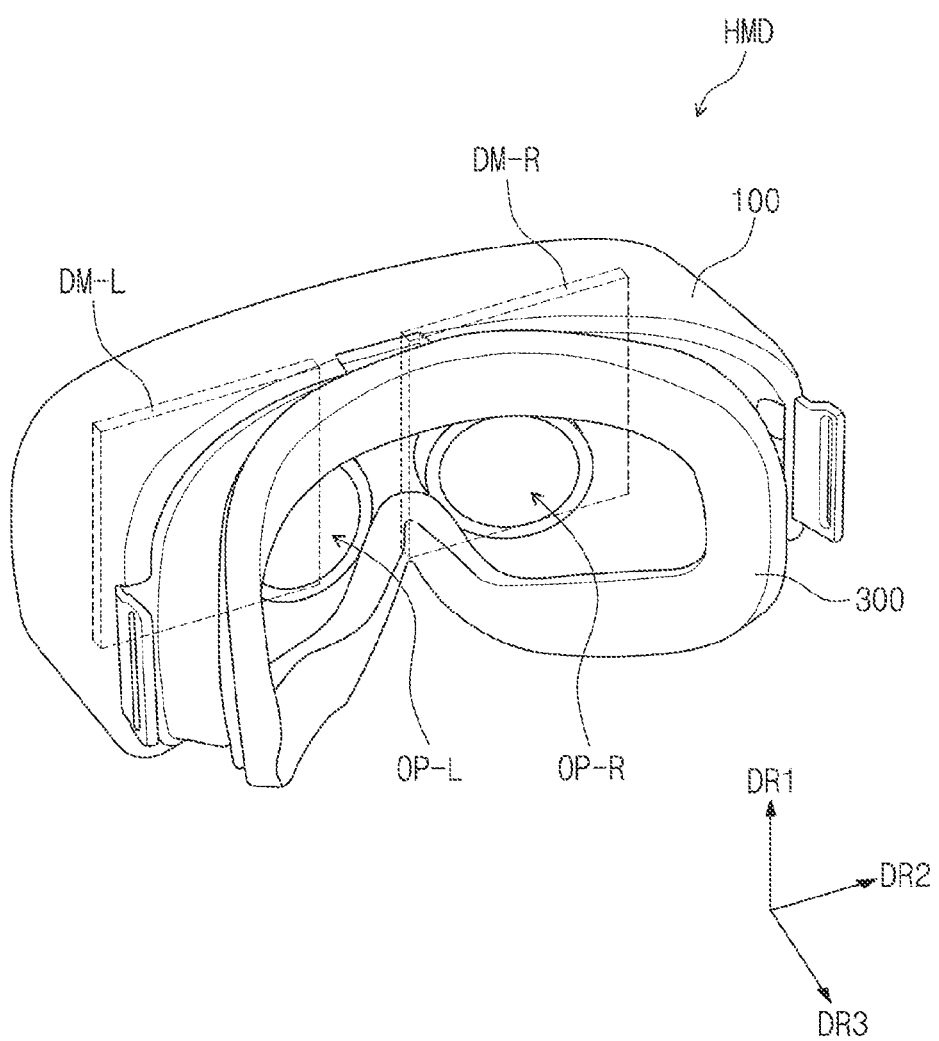
FIG. 3 exemplarily illustrates a body portion, a cushion portion, and display modules of the display device shown in FIG. 1.

The display device HMD may include a body portion 100, a strap portion 200, a cushion portion 300, and display modules DM-L and DM-R (e.g., see FIG. 3).

The body portion 100 may be a portion corresponding to eyes of the user US. The body portion 100 may be configured to contain the display modules DM-L and DM-R displaying an image, an acceleration sensor SS1, a proximity sensor SS2, and a control module CM.

The acceleration sensor SS1 may sense motion of the user US, and the display modules DM-L and DM-R may provide images corresponding to the motion of the user US, to the user US. This may allow the user US to experience virtual reality content that is similar to the real world.

The proximity sensor SS2 may be used to determine whether a user is wearing the display device HMD. For example, the proximity sensor SS2 may be configured to measure a distance to or pressure from a body of the user US to determine whether the user US is wearing the display device HMD.

The control module CM may be configured to allow a user to control sound volume or screen luminance or brightness, and may be provided in the form of a physical button or a touch screen.

The strap portion 200 may be combined with the body portion 100. The strap portion 200 may be used to fix the body portion 100 to a head of the user US.

The strap portion 200 may include a main strap 210 and an auxiliary strap 220.

The main strap 210 may be worn along the head circumference of the user US. The main strap 210 may be configured to bring the body portion 100 into close contact with the head of the user US. The auxiliary strap 220 may be disposed along a top portion of the head of the user US to connect the body portion 100 to the main strap 210. The auxiliary strap 220 may prevent the body portion 100 from sliding downward when being worn by the user US. In addition, the auxiliary strap 220 may disperse a weight of the body portion 100, which may improve the comfort of the user US when the user US is wearing the display device HMD.

The structures or shapes of the body portion 100 and the strap portion 200 may be variously changed from those shown in FIGS. 1 and 2, as long as they can be used to fix the display device HMD to the user US. In an exemplary embodiment, the display device HMD may be provided in the form of a helmet or glasses.

The cushion portion 300 may be disposed on a surface of the body portion 100. The surface may be a surface facing the user US when the display device HMD is worn on the user US. The cushion portion 300 may include a freely deformable material. For example, the cushion portion 300 may include a polymer resin. As an example, the cushion portion 300 may include polyurethane, polycarbonate, polypropylene, or polyethylene, or may include a sponge, which is formed by blowing a rubber solution, urethane-based materials, or acryl-based materials. However, the materials of the cushion portion 300 are not limited to these examples.

The cushion portion 300 may allow for improved comfort of the display device HMD when worn by the user US. The cushion portion 300 may be configured to be attachable or detachable to or from the body portion 100. In an exemplary embodiment, the cushion portion 300 may be omitted.

FIG. 3 exemplarily illustrates the body portion 100, the cushion portion 300, and the display modules DM-L and DM-R of the display device HMD shown in FIG. 1.

Referring to FIG. 3, the display modules DM-L and DM-R may include a left-eye display module DM-L and a right-eye display module DM-R. FIG. 3 illustrates an example of the display device HMD including two display modules DM-L and DM-R. However, the inventive concept is not limited to this example. For example, in an exemplary embodiment, the display device HMD may be configured to include only one display module. That is, in an exemplary embodiment, the left-eye display module DM-L and the right-eye display module DM-R may be provided in the form of a single display module.

Each of the display modules DM-L and DM-R may include a display region, which is used to provide an image to the user US (e.g., see FIG. 2) and is parallel to a plane defined by a first direction DR1 and a second direction DR2. A direction normal to the display region (e.g., a thickness direction of each of the display modules DM-L and DM-R) will be referred to as a third direction DR3.

Two openings OP-L and OP-R may be defined in a region of the body portion 100. The openings OP-L and OP-R may include a left-eye opening OP-L and a right-eye opening OP-R. An image displayed on the left-eye display module DM-L may be provided to the user US through the left-eye opening OP-L, and an image displayed on the right-eye display module DM-R may be provided to the user US through the right-eye opening OP-R.

Since the left-eye display module DM-L and the right-eye display module DM-R provide independent image information to left and right eyes of the user US, the user US may recognize an image provided from the display modules DM-L and DM-R as a three dimensional image.

Figure 4A:
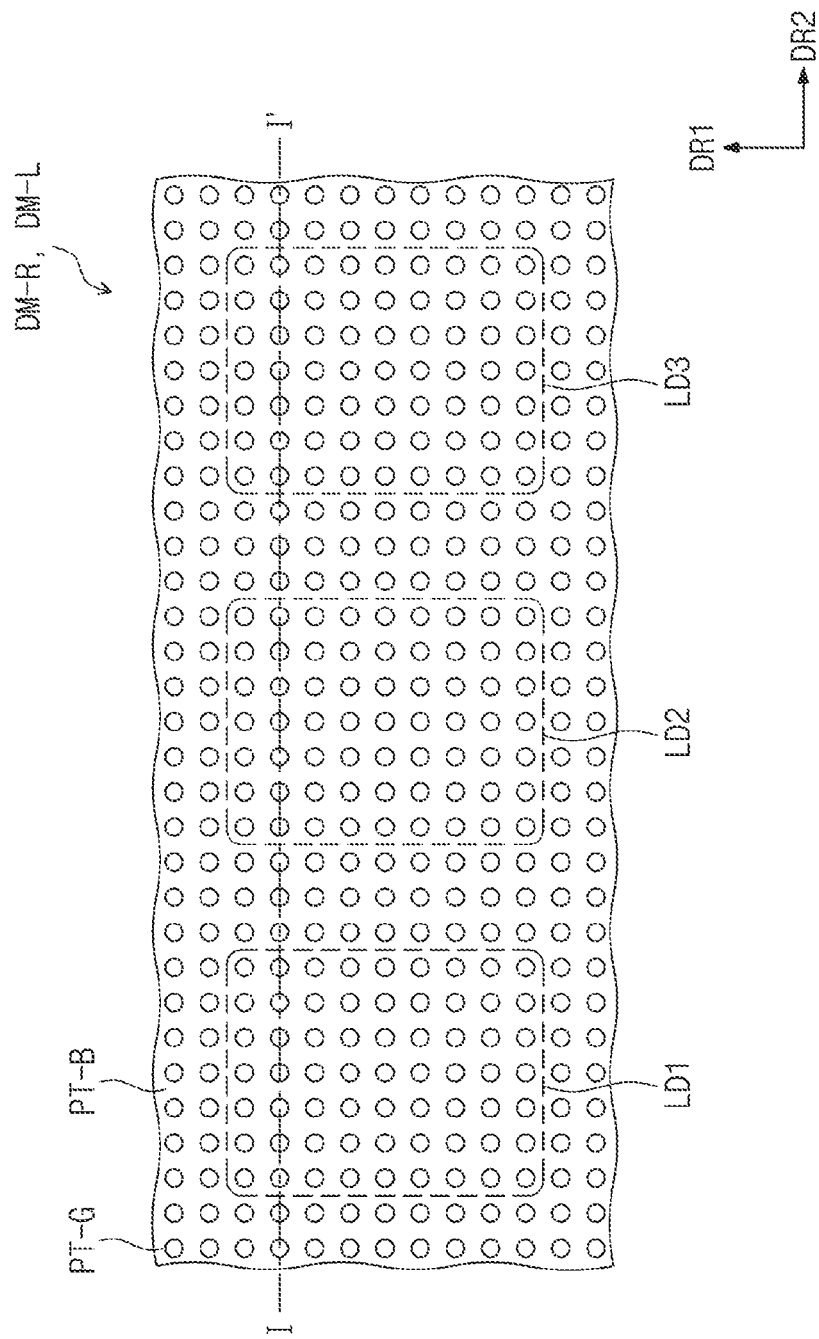
FIG. 4A illustrates an exemplary planar structure of a portion of a display module according to an exemplary embodiment of the inventive concept.
Figure 4B:
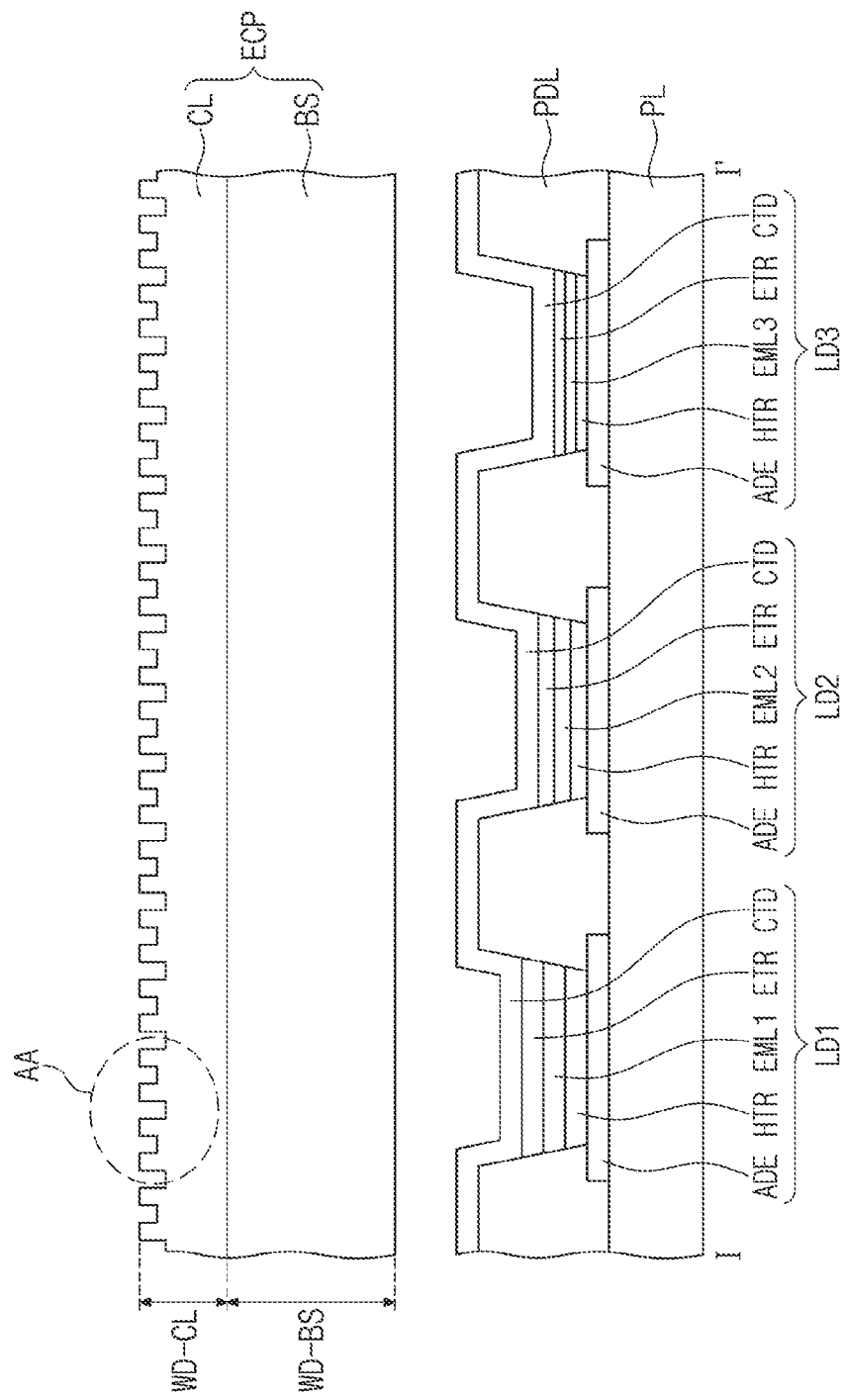
FIG. 4B is a cross-sectional view taken along line I-I' of FIG. 4A.
Figure 5:
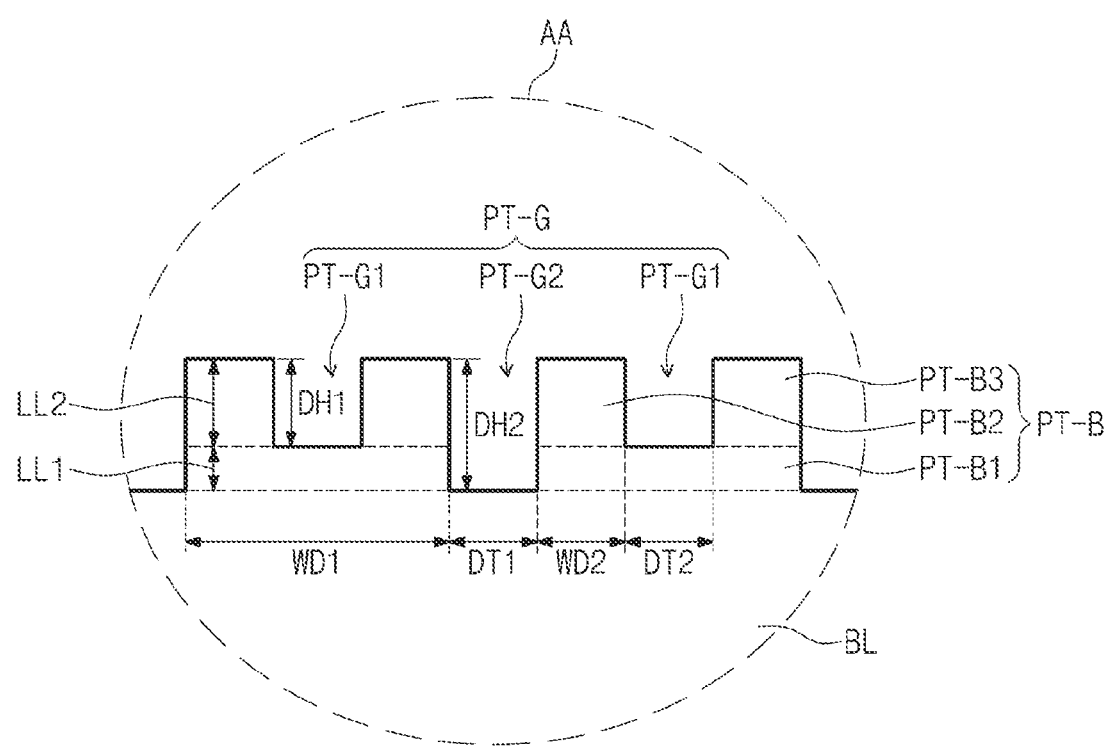
FIG. 5 is an enlarged view of region 'AA' of FIG. 4B.

FIG. 4A illustrates an exemplary planar structure of a portion of the display modules DM-L and DM-R according to an exemplary embodiment of the inventive concept. FIG. 4B is a cross-sectional view taken along line I-I' of FIG. 4A. FIG. 5 is an enlarged view of region 'AA' of FIG. 4B. FIGS.

6A and 6B are graphs exemplarily showing a change in luminance or brightness of a pixel region AR caused by a variation in depth of an intaglio pattern in a cover layer.

Referring to FIG. 4B, each of the display modules DM-L and DM-R may include a planarization layer PL, a plurality of light-emitting elements LD1, LD2, and LD3, a pixel definition layer PDL, and a sealing element ECP.

The planarization layer PL may include an organic material or an inorganic material.

The plurality of light-emitting elements LD1, LD2, and LD3 may be disposed on the planarization layer PL. The light-emitting elements LD1, LD2, and LD3 may emit light having colors that are different from each other. For example, a first light-emitting element LD1 may emit light having a first color, a second light-emitting element LD2 may emit light having a second color different from the first color, and a third light-emitting element LD3 may emit light having a third color different from the first and second colors.

The first light-emitting element LD1 may emit a red light. The first light-emitting element LD1 may include an anode ADE, a hole control region HTR, a first emission layer EML1, an electron control region ETR, and a cathode CTD.

In a case in which the first emission layer EML1 emits a red light, the first emission layer EML1 may include, for example, a fluorescent material including PBD:Eu(DBM)3(Phen)(tris(dibenzoylmethanato)phenanthoroline europium) or Perylene. Dopants included in the first emission layer EML1 may be selected from, for example, metal complexes or organometallic complexes, such as PIQIr(acac)(bis(1-phenylisoquinoline)acetylacetonate iridium), PQIr(acac)(bis(1-phenylquinoline)acetylacetonate iridium), PQIr (tris(1-phenylquinoline)iridium), and PtOEP (octaethylporphyrin platinum).

The second light-emitting element LD2 may emit a green light. The second light-emitting element LD2 may include an anode ADE, a hole control region HTR, a second emission layer EML2, an electron control region ETR, and a cathode CTD.

In a case in which the second emission layer EML2 emits a green light, the second emission layer EML2 may include, for example, fluorescent materials including Alq3(tris(8-hydroxyquinolino)aluminum). Dopants included in the second emission layer EML2 may be selected from metal complexes or organometallic complexes, such as Ir(ppy)3 (fac-tris(2-phenylpyridine)iridium).

The third light-emitting element LD3 may emit a blue light. The third light-emitting element LD3 may include an anode ADE, a hole control region HTR, a third emission layer EML3, an electron control region ETR, and a cathode CTD.

In a case in which the third emission layer EML3 emits a blue light, the third emission layer EML3 may include, for example, a fluorescent material selected from the group consisting of spiro-DPVBi, spiro-6P, DSB (distyryl-benzene) polymers, DSA (distyryl-arylene) polymers, PFO (Polyfluorene) polymers, and PPV (poly(p-phenylene vinylene) polymers. Dopants included in the third emission layer EML3 may be selected from metal complexes or organometallic complexes, such as (4,6-F2ppy)2Irpic.

FIG. 4B illustrates an example in which each of the light-emitting elements LD1, LD2, and LD3 is an organic light emitting diode (OLED). However, the inventive concept is not limited to this example. For example, in an exemplary embodiment, each of the light-emitting elements LD1, LD2, and LD3 may be a micro LED.

The sealing element ECP may seal or encapsulate the light-emitting elements LD1, LD2, and LD3, and may protect the light-emitting elements LD1, LD2, and LD3 from external oxygen or moisture.

The sealing element ECP may include a base part BS and a cover layer CL. A thickness WD-CL of the cover layer CL may be smaller than a thickness WD-BS of the base part BS. For example, the thickness WD-CL of the cover layer CL may range from about 100 μm to about 300 μm, and the thickness WD-BS of the base part BS may range from about 500 nm to about 600 nm.

The base part BS may include a transparent material which allows light emitted from the light-emitting elements LD1, LD2, and LD3 to pass therethrough. The transparent material may be, for example, glass or plastic.

The cover layer CL may be disposed on a surface of the base part BS. For example, the cover layer CL may be disposed directly on the surface of the base part BS such that the cover layer CL is in direct contact with the base part BS. The cover layer CL may include, for example, silicon dioxide.

Referring to FIG. 4A, the cover layer CL may include patterns PT-G and PT-B, which diffract light passed through the base part BS.

The patterns PT-G and PT-B may include intaglio patterns PT-G and relief patterns PT-B. The intaglio patterns PT-G may be formed or engraved in a surface of the cover layer CL, and in this case, relatively protruding portions may be defined as the relief patterns PT-B. For example, in an exemplary embodiment, before the intaglio patterns PT-G are formed in the surface of the cover layer CL, the surface of the cover layer CL may be substantially flat. Upon engraving the intaglio patterns PT-G into the surface of the cover layer CL, the engraved portions PT-G may become recessed relative to the non-engraved portions, and the non-engraved portions may thus form the protruding portions of the cover layer CL corresponding to the relief patterns PT-B.

Herein, when a pattern is described as being engraved in an intaglio manner, it is to be understood that the pattern may be formed by incising the pattern into the intended surface.

In an exemplary embodiment, the intaglio patterns PT-G may be formed by using a photomask (e.g., a slit mask or a half-tone mask).

Referring to FIG. 5, the intaglio patterns PT-G may include a plurality of first intaglio patterns PT-G1 and a plurality of second intaglio patterns PT-G2.

In an exemplary embodiment, a distance between centers of two adjacent ones of the intaglio patterns PT-G may range from about 3 μm to about 12 μm. Each of the first intaglio patterns PT-G1 may be engraved to a first depth DH1, and each of the second intaglio patterns PT-G2 may be engraved to a second depth DH2 different from the first depth DH1. In an exemplary embodiment, the second depth DH2 is deeper than the first depth DH1. For example, the second depth DH2 may extend further into the surface of the cover layer CL than the first depth DH1.

The first intaglio pattern PT-G1 and the second intaglio pattern PT-G2 may be disposed adjacent to each other. For example, the intaglio patterns PT-G having at least two different depths may be disposed in an alternating manner. For example, in an exemplary embodiment, a first intaglio pattern PT-G1 having the first depth DH1 may be disposed directly adjacent to a second intaglio pattern PT-G2 having the second depth DH2, and this arrangement may be continuously repeated. As a result, in an exemplary embodiment, a first intaglio pattern PT-G1 is never directly adjacent to another first intaglio pattern PT-G1, and a second intaglio pattern PT-G2 is never directly adjacent to another second intaglio pattern PT-G2. For example, in such an exemplary embodiment, a first intaglio pattern PT-G1 is always disposed between two second intaglio patterns PT-G2 that are directly adjacent to the first intaglio pattern PT-G1 on opposite sides, and a second intaglio pattern PT-G2 is always disposed between two first intaglio patterns PT-G1 that are directly adjacent to the second intaglio pattern PT-G2 on opposite sides.

In an exemplary embodiment, each of the first depth DH1 and the second depth DH2 may range from about 100 nm to about 200 nm. In an exemplary embodiment, the second depth DH2 may be greater than the first depth DH1, and a difference between the second depth DH2 and the first depth DH1 may range from about 70 nm to about 90 nm.

Since diffraction of light emitted from the light-emitting elements LD1, LD2, and LD3 is determined by the depths of the intaglio patterns PT-G, optical diffraction caused by the first intaglio patterns PT-G1 of the first depth DH1 may be different from optical diffraction caused by the second intaglio patterns PT-G2 of the second depth DH2.

Figure 6A:
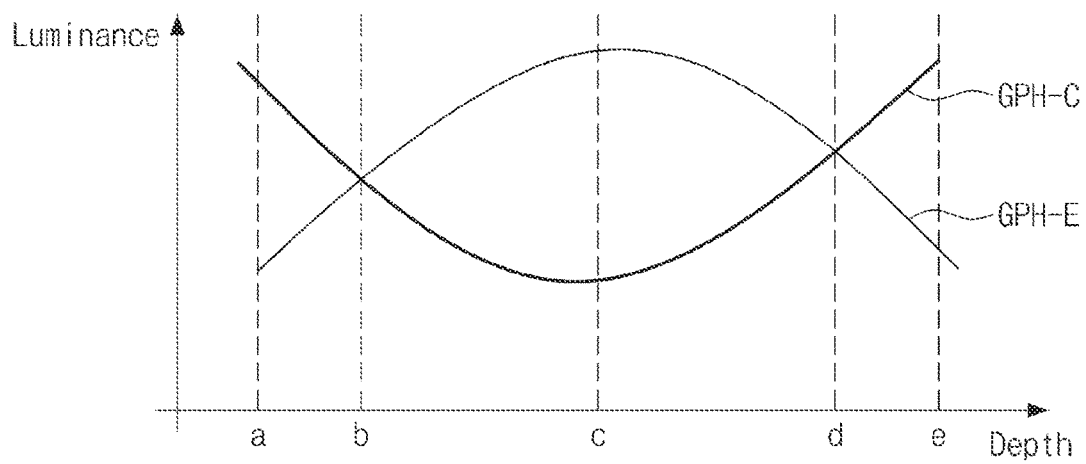
FIGS. 6A and 6B are graphs exemplarily showing a change in luminance of a pixel region caused by a variation in depth of an intaglio pattern in a cover layer.
Figure 6B:
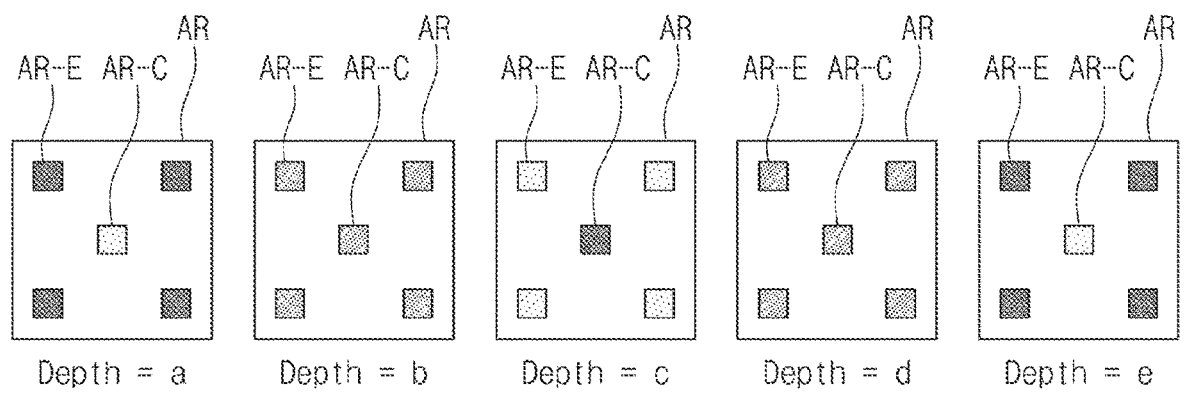

Referring to FIG. 6B, the pixel region AR may be a region corresponding to one of the light-emitting elements LD1, LD2, and LD3. The pixel region AR may include a center region AR-C, which is overlapped with one of the emission layers EML1, EML2, and EML3, and an edge region AR-E, which is adjacent to the center region AR-C.

Referring to FIG. 6A, a first graph GPH-C is a graph showing a change in luminance of the center region AR-C caused by a change in depth of an intaglio pattern PT-G, and a second graph GPH-E is a graph showing a change in luminance of the edge region AR-E caused by a change in depth of the intaglio pattern PT-G.

Referring to FIGS. 6A and 6B, when a depth of the intaglio pattern PT-G is a, luminance of the center region AR-C is higher than luminance of the edge region AR-E. When the depth of the intaglio pattern PT-G is b, which is larger than a, luminance of the center region AR-C is about equal to luminance of the edge region AR-E. When the depth of the intaglio pattern PT-G is c, which is larger than b, luminance of the center region AR-C is lower than luminance of the edge region AR-E. When the depth of the intaglio pattern PT-G is d, which is larger than c, luminance of the center region AR-C is about equal to luminance of the edge region AR-E. When the depth of the intaglio pattern PT-G is e, which is larger than d, luminance of the center region AR-C is higher than luminance of the edge region AR-E.

The difference in luminance between the center region AR-C and the edge region AR-E may result from a change in optical diffraction, which is caused by a change in depth of the intaglio pattern PT-G. Thus, the depth of the intaglio pattern PT-G may be determined based on the difference in luminance between the center region AR-C and the edge region AR-E. For example, the depth of the intaglio pattern PT-G may be determined to be the value of b or d (e.g., see FIG. 6A), at which the luminance of the center region AR-C is about equal to the luminance of the edge region AR-E, which may improve display characteristics (e.g., by providing more uniform luminance across the center region AR-C and the edge region AR-E).

In the actual process of forming the intaglio pattern PT-G, it may be difficult to form the intaglio pattern PT-G at a uniform depth of b or d. Thus, in practice, similar to the case of the depth of a or e, there may be a difference in luminance between the center region AR-C and the edge region AR-E, even when forming the intaglio pattern PT-G at a depth of b or d. Thus, to reduce the difference in luminance between the center region AR-C and the edge region AR-E, a plurality of intaglio patterns PT-G having depths different from each other may be formed in a surface of the cover layer CL, as shown in FIGS. 4B and 5.

In an exemplary embodiment, the intaglio patterns PT-G may be formed in such a way that a difference in depth between patterns is about equal to a difference between b and d. For example, in an exemplary embodiment, the intaglio patterns PT-G may be formed such that a difference in depth between patterns corresponds to the difference between two different depths at which luminance of the center region AR-C and the edge region AR-E is about equal (e.g., points b and d in FIG. 6A). Here, the difference between b and d may range from about 70 nm to about 90 nm. This is a range which can effectively reduce or compensate the difference in luminance between the center region AR-C and the edge region AR-E, but is not within a typical range of process error.

Hereinafter, a structure shown in FIG. 5 (in particular, the relief patterns PT-B) will be described in more detail below.

The cover layer CL may include a base layer BL and the relief patterns PT-B. The base layer BL may be in contact with the base part BS. For example, the base layer BL may directly contact the base part BS.

In an exemplary embodiment, the base layer BL may have a thickness ranging from about 250 nm to about 400 nm.

The relief patterns PT-B may include first relief patterns PT-B1, second relief patterns PT-B2, and third relief patterns PT-B3.

The first relief patterns PT-B1 may protrude from the base layer BL by a first length LL1. The first relief patterns PT-B1 may be spaced apart from each other by a first distance DT1. In an exemplary embodiment, the first length LL1 may range from about 70 nm to about nm. In an exemplary embodiment, the first distance DT1 may range from about 1.5 μm to about 7.5 μm.

In an exemplary embodiment, a width WD1 (hereinafter, a first width) of each of the first relief patterns PT-B1 may range from about 4 μm to about 20 μm.

Each of the second relief patterns PT-B2 may protrude from a first portion of a corresponding first relief pattern PT-B1 by a second length LL2. In an exemplary embodiment, the second length LL2 may range from about 10 nm to about 130 nm.

Each of the third relief patterns PT-B3 may protrude from a second portion of a corresponding first relief pattern PT-B1 by the second length LL2. Thus, in an exemplary embodiment, each first relief pattern PT-B1 may have both a second relief pattern PT-B2 and a third relief pattern PT-B3 extending therefrom.

In an exemplary embodiment, the second length LL2 may have about the same value as the first depth DH1, and a sum of the first length LL1 and the second length LL2 may be about the same value as the second depth DH2.

In an exemplary embodiment, a width WD2 (hereinafter, a second width) of each of the third relief patterns PT-B3 may range from about 1 μm to about 6 μm.

Each of the second relief patterns PT-B2 may be spaced apart from a corresponding one of the third relief patterns PT-B3 by a second distance DT2. In an exemplary embodiment, the second distance DT2 may range from about 1.5 μm to about 7.5 μm. In an exemplary embodiment, the first distance DT1 may be substantially equal to the second distance DT2.

Figure 7:
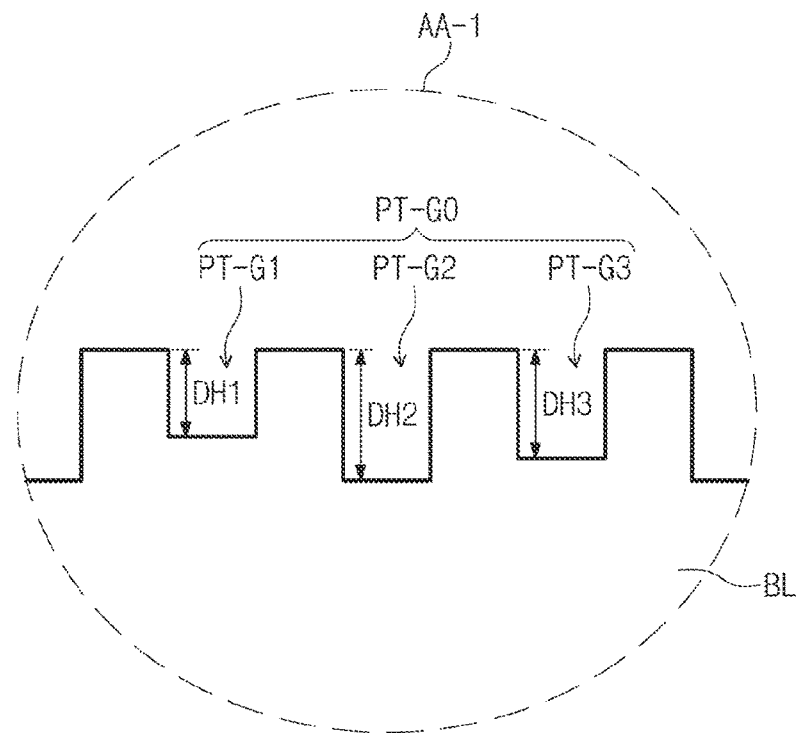
FIGS. 7 and 8 are cross-sectional views each illustrating an example of a modified structure of region 'AA' of FIG. 5.
Figure 8:
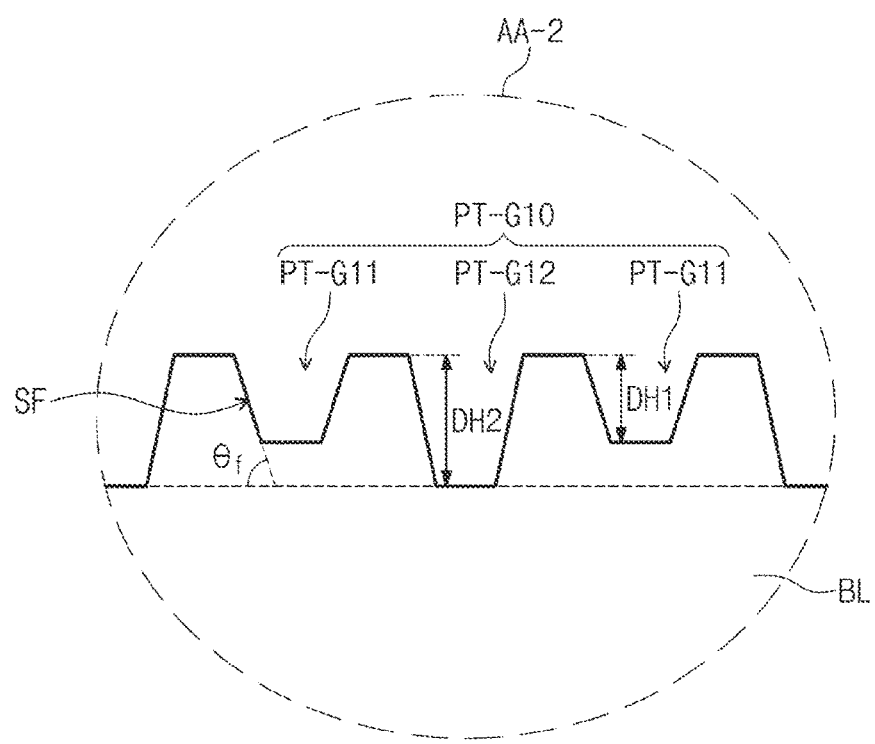

FIGS. 7 and 8 are cross-sectional views each illustrating an example of a modified structure of region 'AA' of FIG. 5.

Referring to region AA-1 of FIG. 7, intaglio patterns PT-G0 may include first intaglio patterns PT-G1, second intaglio patterns PT-G2, and third intaglio patterns PT-G3.

Each of the first intaglio patterns PT-G1 may be engraved to a first depth DH1, each of the second intaglio patterns PT-G2 may be engraved to a second depth DH2 different from the first depth DH1, and each of the third intaglio patterns PT-G3 may be engraved to a third depth DH3 different from the first depth DH1 and the second depth DH2.

In an exemplary embodiment, each of the first depth DH1, the second depth DH2, and the third depth DH3 may range from about 100 nm to about 200 nm.

In an exemplary embodiment, the third depth DH3 may be larger than the first depth DH1, and the second depth DH2 may be larger than the third depth DH3. Here, a difference between the first depth DH1 and the second depth DH2 may range from about 70 nm to about 90 nm.

In an exemplary embodiment, the largest difference between the first depth DH1, the second depth DH2, and the third depth DH3 may range from about 70 nm to about 90 nm. In an exemplary embodiment, the plurality of first intaglio patterns PT-G1, the plurality of second intaglio patterns PT-G2, and the plurality of third intaglio patterns PT-G3 may be alternatingly disposed. For example, as shown in FIG. 7, a second intaglio pattern PT-G2 may be disposed between a first intaglio pattern PT-G1 and a third intaglio pattern PT-G3, and this arrangement may be continuously repeated.

The first intaglio pattern PT-G1, the second intaglio pattern PT-G2, and the third intaglio pattern PT-G3 may be disposed adjacent to each other. For example, the intaglio patterns PT-G0 having depths different from each other may be alternatingly disposed.

Referring to region AA-2 of FIG. 8, intaglio patterns PT-G10 may include first intaglio patterns PT-G11 and second intaglio patterns PT-G12.

In the cover layer CL, an inner side surface SF defining each of the first intaglio patterns PT-G11 and the second intaglio patterns PT-G12 may be inclined at an angle $\theta_f$ of about 60° to about 85°, relative to the base layer BL or the base part BS. In an exemplary embodiment, the inner side surfaces SF defining each of the first intaglio patterns PT-G11 and the second intaglio patterns PT-G12 may be inclined inward toward the center of the corresponding intaglio pattern.

Except for these differences, the structure of FIG. 8 may be configured to have substantially the same structure as that of FIG. 5, and for convenience of explanation, a further description thereof will be omitted.

Figure 9:
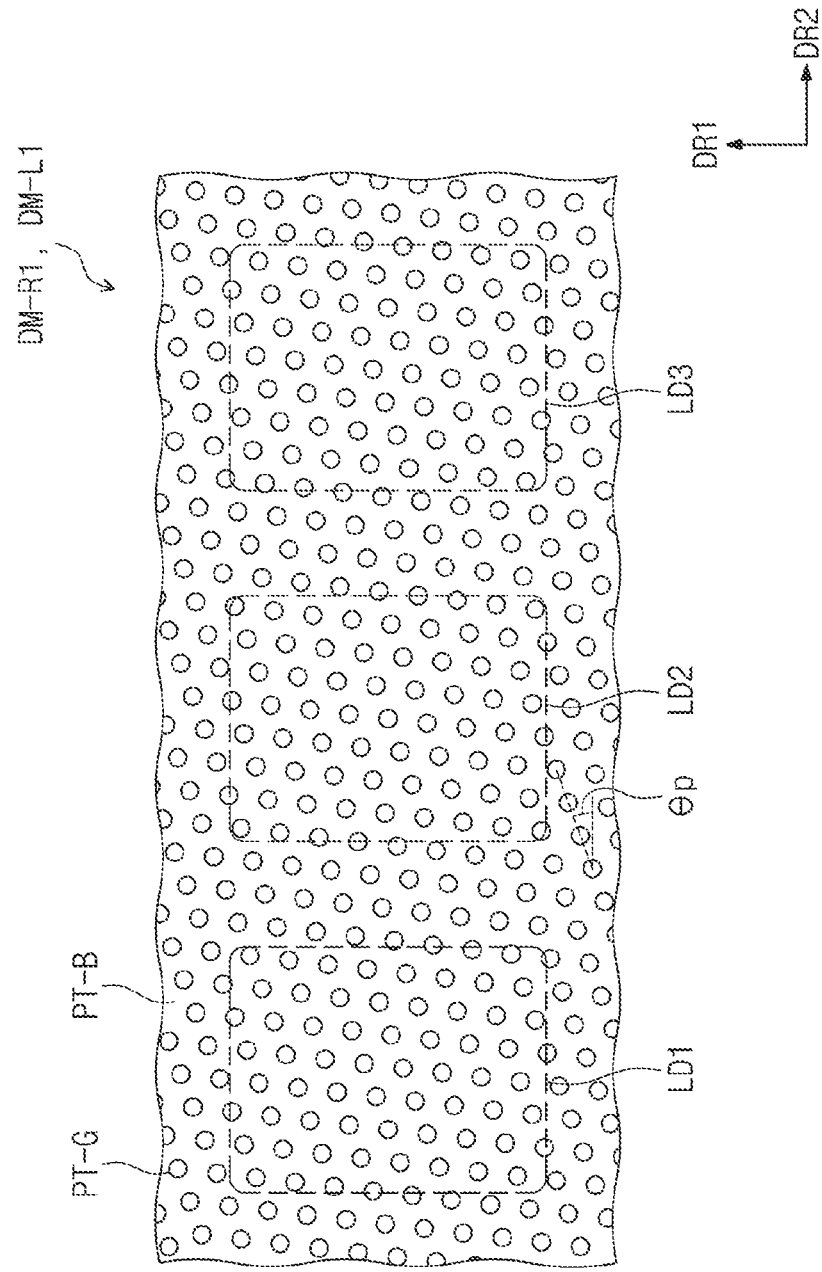
FIG. 9 illustrates an exemplary planar structure of a portion of a display module according to an exemplary embodiment of the inventive concept.

FIG. 9 illustrates an exemplary planar structure of a portion of display modules DM-R1 and DM-L1 according to an exemplary embodiment of the inventive concept.

Referring to FIG. 9, the intaglio patterns PT-G of the display modules DM-R1 and DM-L1 may be arranged in a direction that is inclined at an angle of $\theta_p$ to the second direction DR2. The angle $\theta_p$ may range from about 5° to about 50°.

Figure 10:
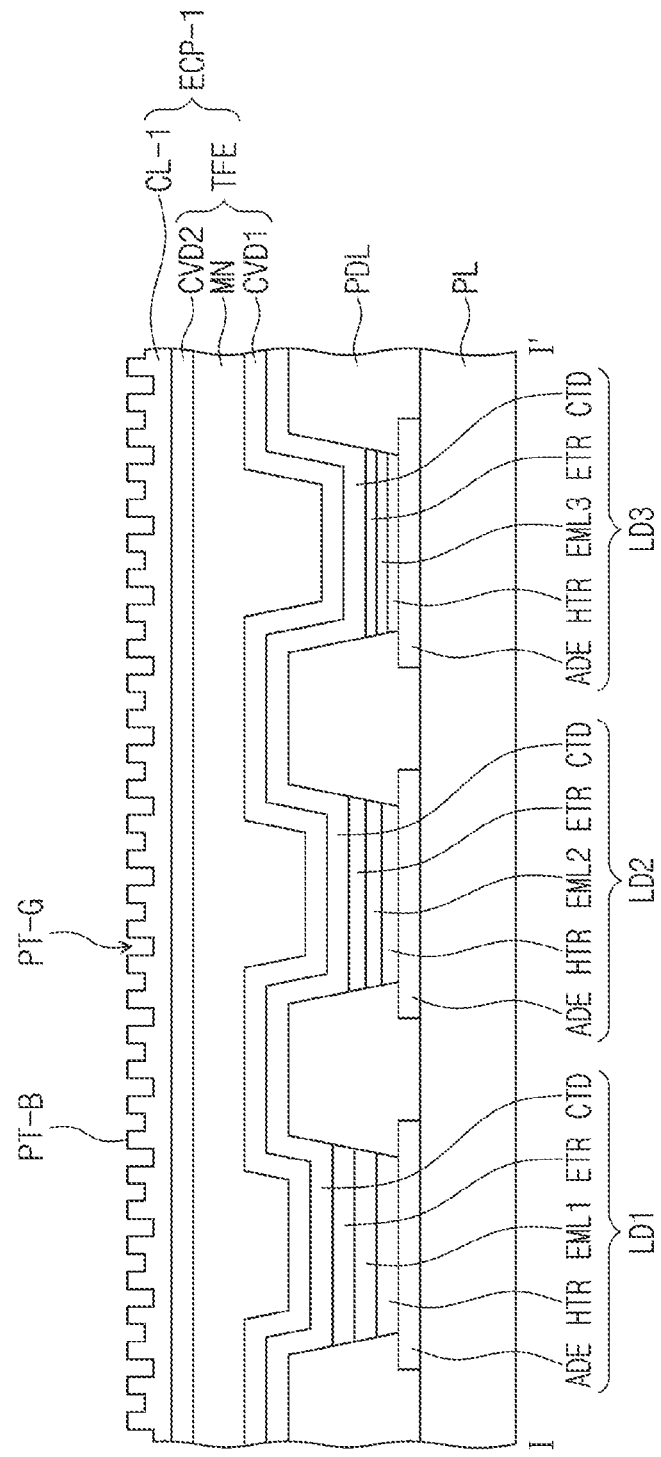
FIGS. 10 and 11 are cross-sectional views taken along line I-I' of FIG. 4A.
Figure 11:
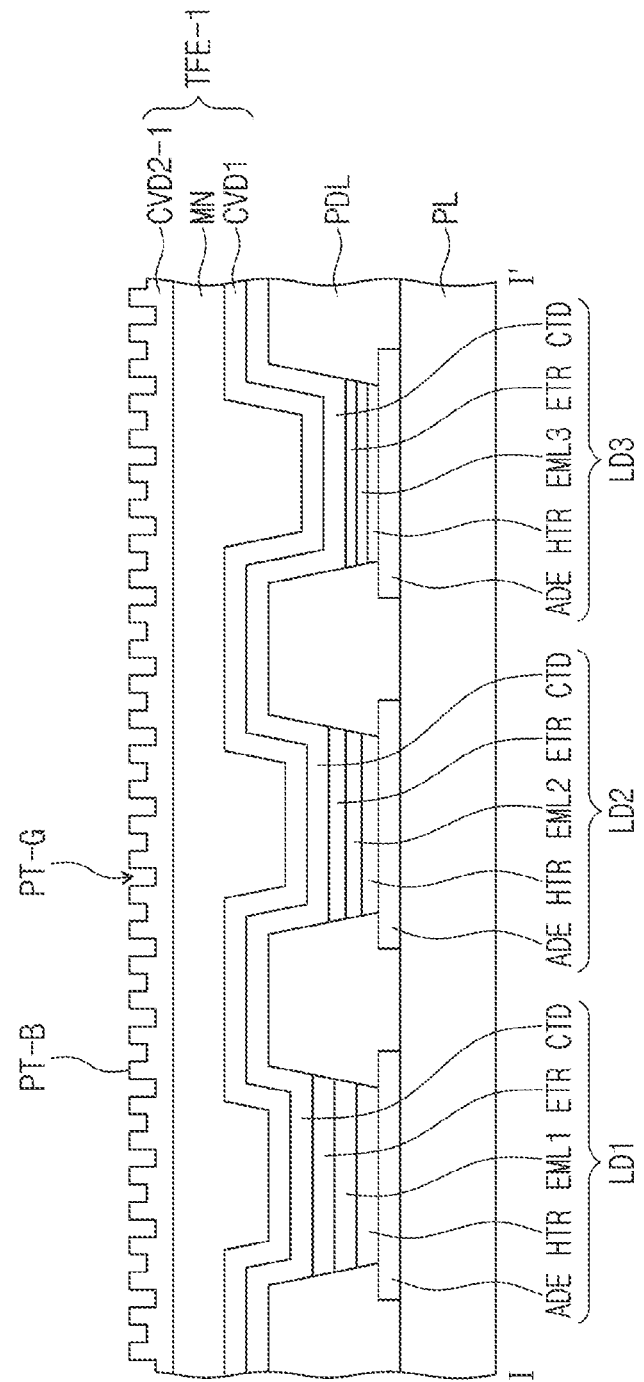

FIGS. 10 and 11 are cross-sectional views taken along line I-I' of FIG. 4A.

Referring to FIG. 10, the light-emitting elements LD1, LD2, and LD3 may be sealed or encapsulated by a sealing element ECP-1. The sealing element ECP-1 may include a thin film encapsulation layer TFE and a cover layer CL-1.

The thin film encapsulation layer TFE may be in contact with the light-emitting elements LD1, LD2, and LD3 and may cover the light-emitting elements LD1, LD2, and LD3.

The thin film encapsulation layer TFE may include a first inorganic layer CVD1, an organic layer MN, and a second inorganic layer CVD2. The organic layer MN may be disposed between the first inorganic layer CVD1 and the second inorganic layer CVD2. FIG. 10 illustrates an example in which the thin film encapsulation layer TFE includes two inorganic layers and one organic layer. However, the inventive concept is not limited to this example. For example, the thin film encapsulation layer TFE may include three inorganic layers and two organic layers, and in this case, the inorganic layer and the organic layers may have an alternatingly-stacked structure.

In an exemplary embodiment, the cover layer CL-1, in which patterns PT-B and PT-G are defined, may be directly disposed on the thin film encapsulation layer TFE.

Except for these differences, the cover layer CL-1 of FIG. 10 may be configured to have substantially the same features as those of the cover layer CL in the previously described exemplary embodiments.

Referring to FIG. 11, the light-emitting elements LD1, LD2, and LD3 may be sealed or encapsulated by a thin film encapsulation layer TFE-1.

The thin film encapsulation layer TFE-1 may include the first inorganic layer CVD1, the organic layer MN, and a second inorganic layer CVD2-1. The organic layer MN may be disposed between the first inorganic layer CVD1 and the second inorganic layer CVD2-1.

The patterns PT-B and PT-G may be defined in the second inorganic layer CVD2-1.

The patterns PT-B and PT-G of the second inorganic layer CVD2-1 may be configured to have substantially the same function as the patterns PT-B and PT-G described with reference to FIGS. 4A to 10.

As is traditional in the field of the inventive concept, exemplary embodiments are described, and illustrated in the drawings, in terms of functional blocks, units and/or modules. Those skilled in the art will appreciate that these blocks, units and/or modules may be physically implemented by electronic (or optical) circuits such as logic circuits, discrete components, microprocessors, hard-wired circuits, memory elements, wiring connections, etc.

According to an exemplary embodiment of the inventive concept, a display device which can suppress a reduced screen-door effect (SDE), and a head-mounted display device including the same, may be realized.

Accordingly, a display device having improved display quality and visibility, and a head-mounted display device including the same, may be provided according to an exemplary embodiment of the inventive concept.

While the inventive concept has been particularly shown and described with reference to the exemplary embodiments thereof, it will be understood by one of ordinary skill in the art that variations in form and detail may be made therein without departing from the spirit and scope of the inventive concept as defined by the following claims.

What is claimed is:
1. A display module, comprising:
a plurality of light-emitting elements; and
a sealing element sealing the plurality of light-emitting elements,
wherein the sealing element comprises:
a base part comprising a transparent material; and
a cover layer in contact with a surface of the base part, wherein the cover layer comprises a plurality of first patterns, each of which is engraved in an intaglio manner to a first depth, and a plurality of second patterns, each of which is engraved in the intaglio manner to a second depth different from the first depth, wherein the cover layer further comprises a plurality of third patterns, each of which is engraved in the intaglio manner to a third depth different from the first depth and the second depth, and the third depth ranges from about 100 nm to about 200 nm, wherein the first patterns form recesses having a bottom surface formed at the first depth and opposing side surfaces in the cover layer, the second patterns form recesses having a bottom surface formed at the second depth and opposing side surfaces in the cover layer, and the bottom surfaces and the opposing side surfaces correspond to an uppermost surface of the cover layer, wherein the first patterns and the second patterns are alternatingly disposed such that, among the bottom surfaces formed at the first depth and the bottom surfaces formed at the second depth, each bottom surface formed at the first depth is directly adjacent to one of the bottom surfaces formed at the second depth.

2. The display module of claim 1, wherein a largest difference between the first depth, the second depth, and the third depth ranges from about 70 nm to about 90 nm.

3. The display module of claim 1, wherein the plurality of first patterns, the plurality of second patterns, and the plurality of third patterns are alternatingly disposed.

4. The display module of claim 1, wherein each of the plurality of second patterns is disposed between one of the plurality of first patterns and one of the plurality of third patterns.

5. A head-mounted display device, comprising:

a display module comprising a plurality of light-emitting elements and a sealing element sealing the light-emitting elements;

a body portion containing the display module, wherein an opening defined in the body portion exposes at least a portion of the display module to a user; and a strap portion connected to the body portion and configured to fix the body portion to a head of the user, wherein the sealing element comprises:

a base part comprising a transparent material; and a cover layer in contact with a surface of the base part, wherein the cover layer comprises a plurality of first patterns, each of which is engraved in an intaglio manner to a first depth, and a plurality of second patterns, each of which is engraved in the intaglio manner to a second depth different from the first depth, wherein the cover layer further comprises a plurality of third patterns, each of which is engraved in the intaglio manner to a third depth different from the first depth and the second depth, and the third depth is larger than the first depth and is smaller than the second depth, wherein the first patterns form recesses having a bottom surface formed at the first depth and opposing side surfaces in the cover layer, the second patterns form recesses having a bottom surface formed at the second depth and opposing side surfaces in the cover layer, and the bottom surfaces and the opposing side surfaces correspond to an uppermost surface of the cover layer, wherein the first patterns and the second patterns are alternatingly disposed such that, among the bottom surfaces formed at the first depth and the bottom surfaces formed at the second depth, each bottom surface formed at the first depth is directly adjacent to one of the bottom surfaces formed at the second depth.

6. The head-mounted display device of claim 5, wherein a largest difference between the first depth, the second depth, and the third depth ranges from about 70 nm to about 90 nm.

7. The head-mounted display device of claim 5, wherein the plurality of first patterns, the plurality of second patterns, and the plurality of third patterns are alternatingly disposed.

8. The head-mounted display device of claim 5, wherein each of the plurality of second patterns is disposed between one of the plurality of first patterns and one of the plurality of third patterns.

* * * * *